(12) United States Patent
Bertele et al.

(10) Patent No.: US 8,528,461 B2
(45) Date of Patent: Sep. 10, 2013

(54) FORCE ACTUATOR

(75) Inventors: Andreas Bertele, Koenigsbronn (DE); Peter Vogt, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1130 days.

(21) Appl. No.: 12/196,391

(22) Filed: Aug. 22, 2008

(65) Prior Publication Data

US 2009/0091720 A1  Apr. 9, 2009

(30) Foreign Application Priority Data

Aug. 24, 2007 (DE) .................. 10 2007 040 363
Dec. 27, 2007 (DE) .................. 10 2007 063 293

(51) Int. Cl.
  *F15B 15/00* (2006.01)
  *G03B 27/52* (2006.01)
  *G02B 7/182* (2006.01)
  *G03F 7/20* (2006.01)

(52) U.S. Cl.
  CPC .................. *G03F 7/70825* (2013.01)
  USPC .................. 91/519; 355/55; 359/878

(58) Field of Classification Search
  CPC .................. G03F 7/70825
  USPC .................. 91/508, 519, 520; 355/52, 53, 55; 359/291, 822, 878; 92/34, 35, 37–39
  See application file for complete search history.

(56) References Cited

U.S. PATENT DOCUMENTS

| | | | | |
|---|---|---|---|---|
| 2,387,793 A * | 10/1945 | Holmes | ........................ | 236/99 R |
| 3,384,868 A * | 5/1968 | Brown et al. | .................. | 367/143 |
| 3,742,969 A * | 7/1973 | Siegel | .............................. | 137/85 |
| 4,006,329 A * | 2/1977 | Hellman et al. | ........... | 200/83 D |
| 4,011,724 A * | 3/1977 | Landes et al. | ................... | 60/567 |
| 6,388,823 B1 | 5/2002 | Gaber et al. | | |
| 7,193,794 B2 | 3/2007 | Beck et al. | | |
| 2005/0157413 A1 | 7/2005 | Oshima et al. | | |
| 2005/0162762 A1 | 7/2005 | Novak | | |
| 2006/0139585 A1* | 6/2006 | Maria Van Der Wijst et al. | ................................ | 355/52 |
| 2008/0013068 A1* | 1/2008 | Jeunink et al. | .................. | 355/75 |
| 2009/0052066 A1* | 2/2009 | Kwan et al. | .................... | 359/823 |

FOREIGN PATENT DOCUMENTS

| | | |
|---|---|---|
| DE | 28 17 239 | 11/1978 |
| DE | 34 44 978 | 6/1986 |
| DE | 35 02 024 | 7/1986 |
| DE | 198 27 603 A1 | 12/1999 |
| DE | 101 40 608 | 3/2003 |
| DE | 10 2004 046 531 | 8/2005 |
| FR | 2 389 145 | 11/1978 |

* cited by examiner

*Primary Examiner* — Steven H Whitesell Gordon
(74) *Attorney, Agent, or Firm* — Fish & Richardson P.C.

(57) ABSTRACT

Actuator arrangements are disclosed. An actuator arrangement can include a first fluidic-based actuator device designed to exert a first force on a first location of a body associated with the first actuator device. An actuator arrangement can also include a second fluidic-based actuator device designed to exert a second force on a second location of the body associated with the first actuator device. The distance between the first and second locations can be small. The maximum value of the second force can be less than the maximum value of the first force.

32 Claims, 5 Drawing Sheets

FORCE ACTUATOR

CROSS-REFERENCE TO RELATED APPLICATIONS

This application claims the benefit under 35 USC §119 of German patent application 10 0 2007 040 363.3, filed Aug. 24, 2007, and German patent application 10 2007 063 293.4, filed Dec. 27, 2007. The entire disclosure of both of these applications is incorporated herein by reference.

BACKGROUND OF THE INVENTION

The present invention concerns an actuator arrangement which allows a defined force to be applied to a body and which can be employed in particular in connection with an optical imaging apparatus. The invention can be employed in the field of microlithography, which is used in connection with the manufacture of microelectronic circuits. The invention further extends to an optical imaging method which can be performed, among other processes, with the optical imaging apparatus according to the invention.

Particularly in the realm of microlithography it is imperative, among other requirements besides using components of the highest possible precision, that the position and geometry of the components of the imaging apparatus, i.e. for example the optical elements such as lenses, mirrors or reticles be kept as constant as possible in order to achieve a high image quality. The high requirements for accuracy in the microscopic range at an order of magnitude of a few nanometers and below are in large part a consequence of the constant need to increase the resolution of the optical systems that are used in the manufacture of microelectronic circuits, in order to further advance the miniaturization of the microelectronic components being manufactured.

As a means to achieve an increased resolution, one can either use light of a shorter wavelength, as is the case in systems operating in the extreme UV range (EUV) at operating wavelengths in the range of 13 nm, or one can increase the numerical aperture of the projection system. One possibility to significantly increase the numerical aperture above a value of 1.0 is realized with so-called immersion systems, where the space between the last optical element of the projection system and the substrate that is to be exposed is occupied by an immersion medium whose refractive index is larger than 1.0. A further increase of the numerical aperture is possible with optical elements of a particularly high refractive index.

With a shorter operating wavelength as well as with a higher numerical aperture, not only will the optical elements that are being used have to meet more stringent requirements on positioning accuracy and on the ability to hold their dimensions over the entire operating life, but there will of course also be increased requirements to minimize the imaging errors of the entire optical arrangement.

A known concept to minimize imaging errors is to subject the optical elements involved to an active deformation in order to change their optical characteristics in such a way as to counteract one or more specific imaging errors of the optical system (even to the extent of completely correcting the imaging error). In order to achieve the desired deformation of the optical element, suitable forces are applied to the optical element through a diversity of actuators.

In many cases, so-called N-wave deformations (where N is an integer larger than 1) are generated in order to effect the correction of imaging errors. Normally, this involves subjecting the optical element to actuator forces (normally parallel to the optical axis of the optical system) which are applied at N locations distributed (in most cases evenly) on the circumference of the optical element. In between the points of application of the actuator forces, the optical element is seated against support elements or further actuators (which are normally set along the circumferential direction halfway between every two neighboring points of application of the actuator forces). The result is, accordingly, a deformation with an undulating shape in the circumferential direction of the optical element. An arrangement of the kind has been described for example in DE 198 27 603 A1 (Holderer et al.), whose entire disclosure is incorporated herein by reference.

This wave-shaped deformation can be used to compensate for imaging errors of the kinds which are caused for example when optical elements of optical systems are heating up. It is normally necessary to superimpose deformations of different order N on each other in order to achieve a desired corrective effect. With an arrangement designed for a certain maximum order N, it is also possible to produce deformations of a lower order. For example, with an arrangement for a 4-wave deformation, it is also possible to produce a 2-wave deformation.

This concept is often implemented with fluidic actuators, which allow a desired actuator force to be generated by setting a corresponding pressure in an actuator chamber. Such fluidic actuators have the advantage that there is an exactly defined relationship between the pressure in the actuator chamber and the actuator force generated by the actuator, so that the actuator force can be regulated simply by regulating the pressure in the actuator chamber.

This arrangement poses the problem that, depending on the geometry of the optical element, a significantly smaller actuator force may be required for a lower-order deformation than for a higher-order deformation. Accordingly, if this is the case, a lower-order deformation will be significantly more sensitive than a higher-order deformation in regard to errors that may occur in setting the actuator force.

Thus, it is possible for example in lenses that are thick at the border, that a 4-wave deformation will require a 20 times larger actuator force than a 2-wave deformation of the same amplitude. This represents a disadvantage in that the pressure regulation has to be designed for the maximum pressure to be generated in the actuator chamber and consequently, if the relative accuracy of the pressure regulation is assumed to be approximately constant, the absolute accuracy of the setting for the smaller actuator forces for the 2-wave deformation is reduced by a corresponding factor.

Finally, besides the aforementioned actuator arrangements, an actuator arrangement for deforming a lens is described in DE 198 27 603 A1 among other subjects, wherein two identical actuators, arranged in diametrically opposite locations (relative to the optical axis of the lens) and acting parallel to the plane of the lens, are introducing bending moments into the lens by way of the lens mount. This arrangement, too, suffers from the aforementioned drawbacks.

BRIEF SUMMARY OF THE INVENTION

It is therefore the object of the present invention to provide an actuator arrangement, an optical arrangement with an actuator arrangement, an optical imaging apparatus with an actuator arrangement, and an optical imaging process which uses an actuator arrangement, wherein the aforementioned disadvantages are absent or at least occur only to a lesser degree and wherein in particular the actuator force can be set more accurately for different levels of magnitude of the force.

The present invention is based on the observation that a higher accuracy in setting the actuator force at different levels of force can be achieved easily through a concept where the actuator force that is called for is generated by separately producing individual actuator forces of different levels of magnitude through separate actuator arrangements and superimposing these individual actuator forces on each other to produce the desired resultant actuator force. This opens a simple way to design each of the separate actuator devices for the respective level of force, so that in each case the setting accuracy is optimized for the respective level of force.

As is self-evident, the invention can be used in connection with any desired actuator principles. For example, any electrical and/or fluidic actuators can be used to realize the two actuator arrangements. Of course, it is also possible to use any combination of different actuator principles. Particularly advantageous versions are obtained by using fluidic actuators.

In fluidic actuators, the setting accuracy can be optimized through the components of the actuator chamber and/or the components of the pressure regulation. For example, while using identical components of the pressure regulation (i.e. with the same maximum pressure level), an adaptation to different levels of force is possible simply through an adaptation of the effective surface area of the actuator chamber. Likewise with the exact opposite concept, if identical components are used for the actuator chamber, the adaptation to the required level of force is possible simply through an adaptation of the pressure level of the pressure regulation. Finally, it is also possible with identical components for the actuator chamber and the pressure regulation to achieve an adaptation to the required force level by using a commensurate amount of force reduction (for example by way of a transmitting mechanism) which is arranged downstream of the actuator chamber.

Therefore, one object of the present invention is an actuator arrangement, serving in particular to introduce a deformation in an optical element with a first, specifically fluidic-based actuator device, which is designed to exert on a body associated with the first actuator device a first actuator force in an amount up a first maximum force value. The actuator arrangement further includes a second, specifically fluidic-based actuator device, which is designed to exert on the body associated with the first actuator device a second actuator force in an amount up a second maximum force value. The second actuator device is arranged in such a way in relation to the first actuator device that the respective lines of action of the first actuator force and the second actuator force have at most a small distance from each other in the area of the their respective points of application on the body. Furthermore, the second maximum value of the second actuator force is smaller than the first maximum value of the first actuator force.

A further object of the present invention is an optical arrangement, specifically for the field of microlithography, with an optical element and a supporting structure, wherein the supporting structure supports the optical element and includes at least one actuator arrangement functioning as a force actuator according to the invention, which is connected to the optical element.

A further object of the present invention is an optical imaging arrangement, specifically for the field of microlithography, with an illumination device, a mask device designed to receive a mask that includes a design pattern to be projected, a projection device with a plurality of optical elements, and a substrate device serving to receive a substrate, wherein the illumination device is designed to illuminate the design pattern and the optical elements are designed to project an image of the design pattern onto the substrate, and wherein the projection device includes an optical arrangement according to the invention, which in turn includes one of the optical elements.

A further object of the present invention is a method of exerting forces on a body by means of at least one force actuator, specifically for the purpose of causing a deformation of the body, wherein by means of a first, specifically fluidic-based actuator device of a force actuator a first actuator force of a magnitude up to a first maximum force value is exerted on the body. Furthermore, a second actuator force in an amount up a second maximum force value is exerted on the body by means of a second, specifically fluidic-based actuator device, wherein the respective lines of action of the first actuator force and the second actuator force have at most a small distance from each other in the area of the their respective points of application on the body, and the second maximum value of the second actuator force is smaller than the first maximum value of the first actuator force.

A further object of the present invention is a an optical imaging method, in particular for the field of microlithography, wherein an image of a design pattern is projected onto a substrate by means of a plurality of optical elements, wherein an imaging error in the projection of the design pattern onto the substrate is registered, and wherein based on the registered imaging error at least one of the optical elements is subjected to a deformation by way of a method according to the invention in order to change the optical properties of said element and to thereby reduce the imaging error.

A further object of the present invention is an actuator arrangement, serving in particular to cause a deformation in an optical element with a first, specifically fluidic-based actuator device, wherein the first actuator device includes a first actuator chamber, and the first actuator device is designed to exert a first actuator force on a body associated with the first actuator device. The actuator arrangement further includes a second, specifically fluidic-based actuator device, wherein the second actuator device includes a second actuator chamber. The second actuator device which is designed to exert on the body associated with the first actuator device a second actuator force. The first actuator chamber and the second actuator chamber are arranged so that they are nested inside each other.

Further preferred embodiments of the invention are presented in the subordinate claims and in the following description of examples of preferred embodiments with references to the attached drawings.

DETAILED DESCRIPTION OF THE INVENTION

First Example

Making reference to FIGS. 1 to 5, following is a description of a preferred embodiment of the optical imaging apparatus according to the invention for use in microlithography.

Figure 1:
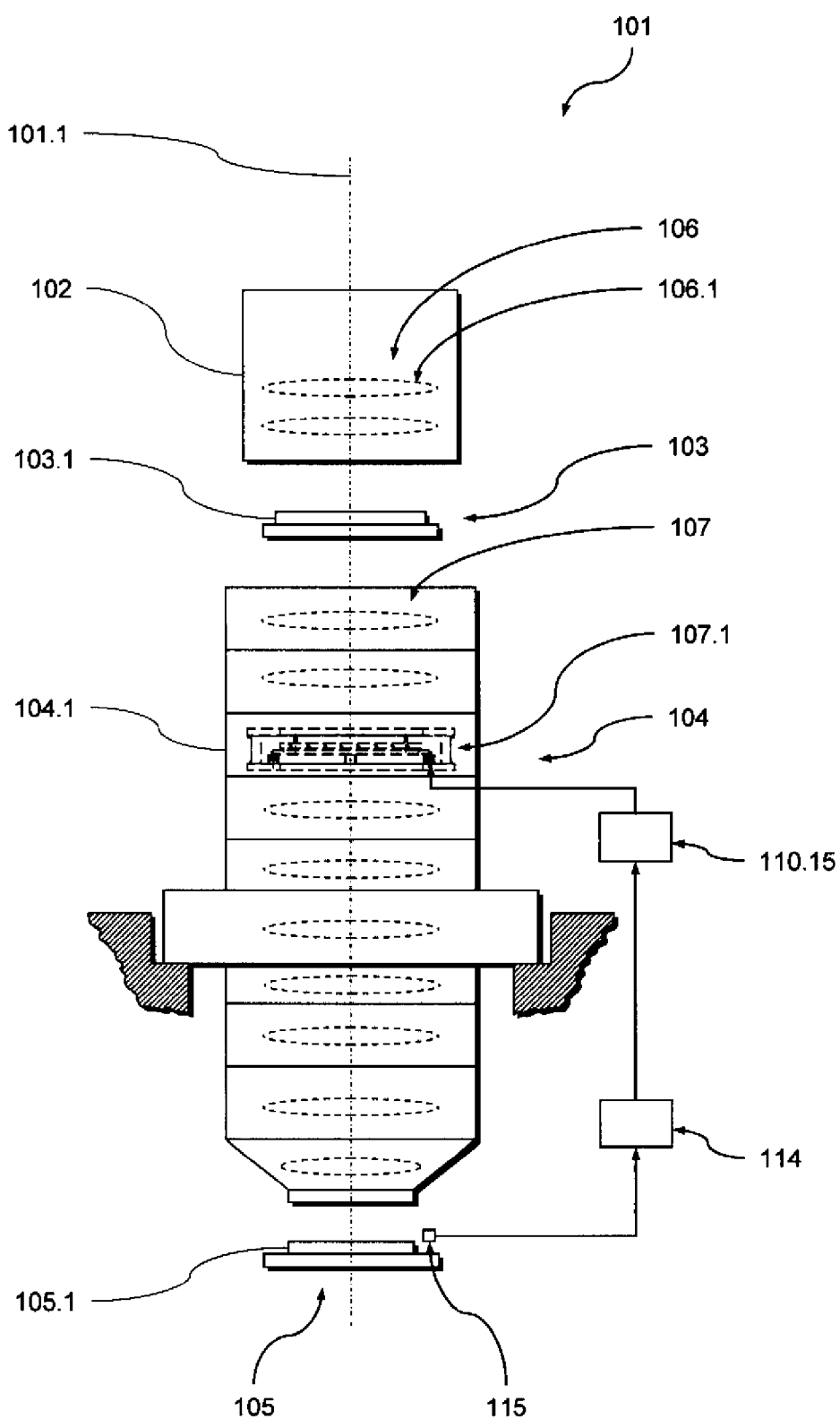
FIG. 1 is a schematic representation of a preferred embodiment of the imaging apparatus according to the invention, which includes a preferred embodiment of the optical arrangement according to the invention with a preferred embodiment of the actuator arrangement according to the invention.

FIG. 1 shows a schematic representation, not drawn to scale, of a preferred embodiment of the optical imaging apparatus according to the invention in the form of a microlithography apparatus 101 which operates with light in the UV range with a wavelength of 193 nm. However, it should be understood that the invention can also find application in connection with any other optical imaging apparatus which may operate at any desired different wavelengths.

The microlithography apparatus 101 includes an illumination system 102, a mask device in the form of a mask stage 103, an optical projection system in the form of an objective 104, and a substrate device in the form of a wafer stage 105. The illumination system 102 illuminates a mask 103.1 which is arranged on the mask stage 103 with a projection light bundle (not shown in the drawing) with a wavelength of 193 nm. The mask 103.1 carries a design pattern that is to be projected by the projection light bundle through the optical elements arranged in the objective 104 onto a substrate in the form of a wafer 105.1 which is arranged on the wafer stage 105.

The illumination system 102 and the objective 104 each contain an optical element group 106, 107, respectively, wherein each group is formed by a series of optical modules 106.1 and 107.1, whose optical elements are arranged along an optical axis 101.1 (which may be folded) of the microlithography apparatus 101. The optical modules 107.1 are secured in the housing 104.1 of the objective 104. To work at an operating wavelength of 193 nm, the optical elements selected for the optical modules 106.1 and 107.1 are refractive optical elements, i.e. lenses or the like. However, it should be understood that in other embodiments of the invention, it is also possible to use any other desired optical elements. One could in particular use refractive, reflective or diffractive optical elements by themselves or in any desired combination.

Figure 2:
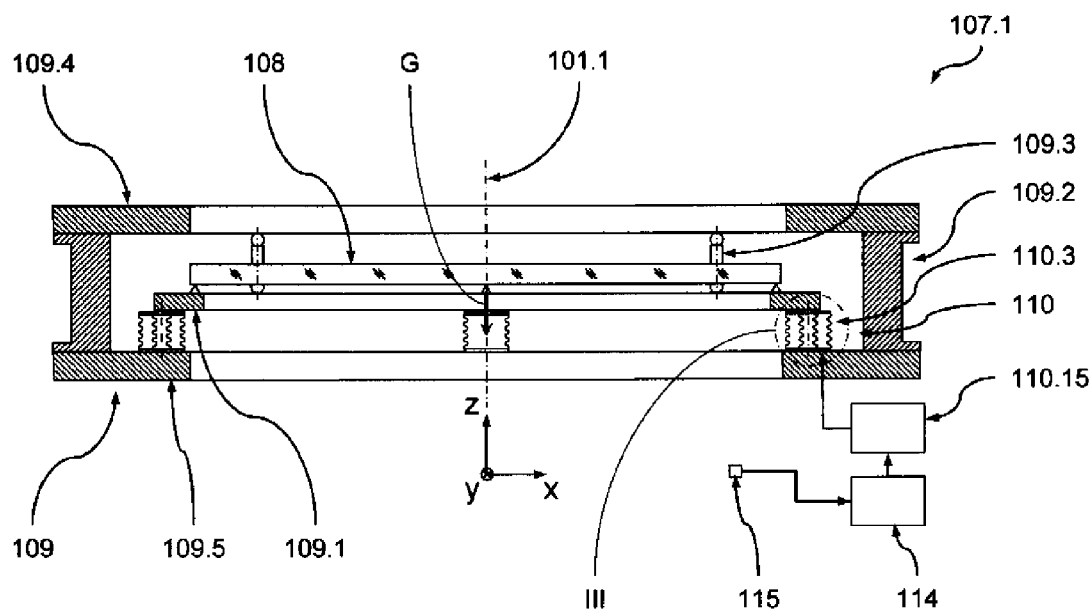
FIG. 2 is a schematic, in part sectional view of a portion of the imaging apparatus of FIG. 1.

FIG. 2 illustrates a preferred embodiment of the optical arrangement according to the invention in the form of an optical module 107.1. As can be seen in FIG. 2, the optical module 107.1 includes a first optical element in the form of a lens 108 which is held by a supporting structure 109. The supporting structure 109 includes a ring-shaped lens holder 109.1 which is in contact with the lens 108. The lens holder 109.1, in turn, is supported by a ring-shaped support device 109.2 which is connected, in turn, to the housing 104.1 of the objective 104.

The lens holder 109 is connected by way of four holder elements 109.3 to an upper ring-shaped support element 109.4. The holder elements 109.3 in the neutral state shown in FIG. 2 take up the weight force G of the subassembly consisting of the lens holder 109.1 and the lens 108.

The holder elements 109.3 are evenly distributed over the circumference of the lens holder 109.1. They define the position (location and/or orientation) of the subassembly consisting of the lens holder 109.1 and the lens 108. To perform this function, the holder elements 109.3 can be configured as simple passive elements. However, it is also possible that the holder elements 109.3 are configured as active elements which allow the position of the subassembly consisting of the lens holder 109.1 and the lens 108 to be actively adjusted under the control of a controller device connected to the holder elements.

The supporting structure 109 further includes four actuator arrangements of identical design conforming to the invention, in the form of fluidic force actuators 110, 111, 112 and 113 which are arranged at uniform intervals over the circumference of the lens holder 109.1. However, it should be understood that different embodiments of the invention could also be equipped with any other desired number of force actuators, wherein the number of force actuators, as will be explained in detail hereinafter, depends on a desired mode of deformation of the optical element 108. The holder elements 109.3 and the force actuators 110 are distributed in alternating sequence and at essentially equal intervals over the circumference of the lens holder 109.1, so that each holder element 109.3 is rotated (relative to the optical axis 101.1) by an angle of about 45° relative to a neighboring force actuator 110.

Figure 3:
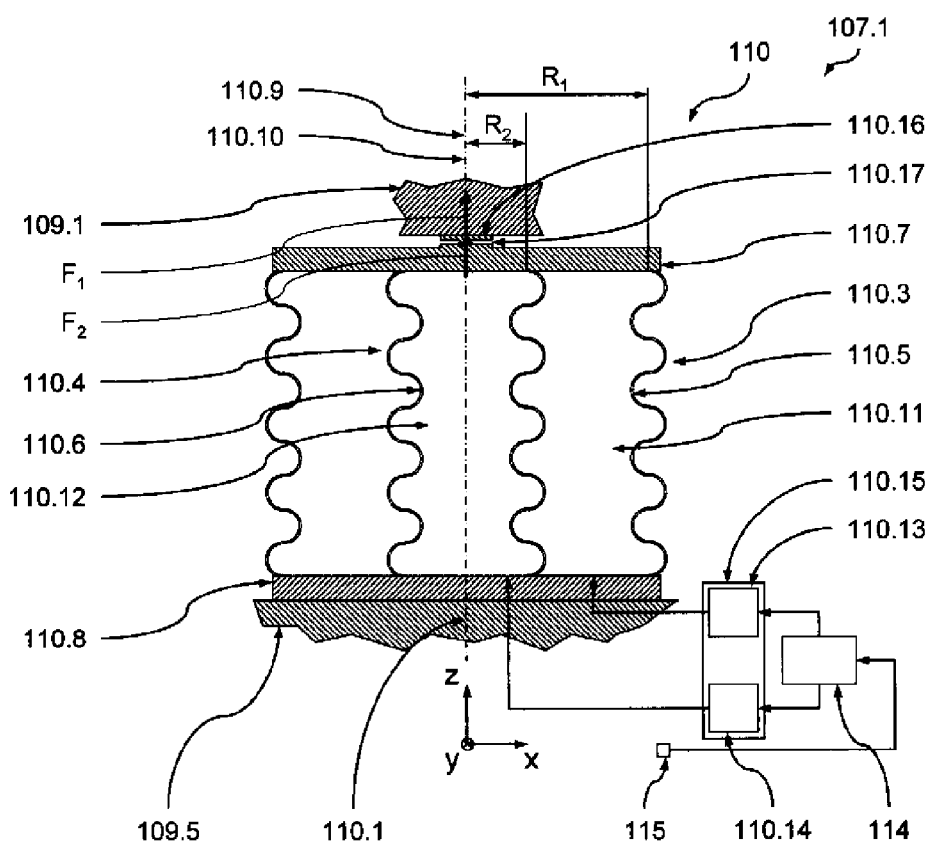
FIG. 3 represents a schematic partial cross-section of the detail III of FIG. 2.

As can be seen in particular in FIG. 3, the force actuator 110 is connected at a first end to a lower ring-shaped support element 109.5 of the support device 109.2. The force actuator 110 is further connected at its second end to the lower surface of the lens holder 109.1 in order to exert along a thrust axis 110.1 a resultant actuator force $F_{res}$ on the lens holder 109.1.

The force actuator 110 includes among other things a first fluidic actuator device 110.3 and a second fluidic actuator device 110.4. These devices are implemented in the force actuator 110 through a generally cylindrical, thin-walled first wall element 110.5 and a likewise generally cylindrical, thin-walled second wall element 110.6, an upper actuator element 110.7, and a bottom element 110.8. The upper actuator element 110.7 is solidly connected in a suitable way to the lens holder 109.1, while the bottom element 110.8 is solidly connected in a suitable way to the lower support element 109.5, so that the force actuator 110 can transmit along its thrust axis 110.1 the tensile forces as well as compressive forces between the lens holder 109.1 and the lower support element 109.5.

It should be understood that the first and/or the second wall element need not necessarily have a cylindrical geometry. In other embodiments of the invention, one may also select any other desired geometry, for example a prismatic geometry with a polygonal cross-section perpendicular to the thrust axis.

The cylinder axis of the first wall element 110.3 defines a first thrust axis 110.9, while the cylinder axis of the second first wall element 110.4 defines a second thrust axis 110.10. The first wall element 110.5 and the second wall element 110.6 are concentric relative to each other. Accordingly, the first thrust axis 110.9 and the second thrust axis 110.10 coincide with the thrust axis 110.1 of the force actuator 110. However, it should be understood that in other embodiments of the invention the respective thrust axes of the two wall elements could also be spaced apart from each other.

The first wall element 110.5 is connected gas-tight to the actuator element 110.7 and the bottom element 110.8 and thus defines a ring-shaped first actuator chamber 110.11 of the first actuator device 110.3. The second wall element is likewise connected gas-tight to the actuator element 110.7 and the bottom element 110.8 and thus defines a second actuator chamber 110.12 of the second actuator device 110.4, which is surrounded by the first actuator chamber 110.9.

Accordingly, the first actuator chamber 110.11 and the second actuator chamber 110.12, and thus the first actuator device 110.3 and the second actuator device 110.4 are arranged kinematically parallel and nested inside each other, whereby a particularly compact arrangement is achieved.

However, it should be understood that such a nested arrangement of the kinematically parallel actuator devices is not a necessary requirement in other embodiments of the invention. For example, with a suitable design of the actuator element a configuration can be achieved where the actuator chambers are not nested inside each other even with a kinematically parallel arrangement and collinear thrust axes of the two actuator chambers. This is possible for example with an arrangement where the outer, ring-shaped actuator chamber only encloses a bottom element, which extends completely through the space enclosed by the ring-shaped actuator chamber and on which the second actuator chamber is supported only outside of said space.

The first actuator device 110.3 includes a pressure regulation device 110.13 which supplies the first actuator chamber 110.11 with a first actuator fluid at a first pressure $p_1$, so that in the first actuator chamber 110.11 a first relative pressure $\Delta p_1$ establishes itself relative to the pressure $p_a$ of the atmosphere surrounding the force actuator 112, which may be expressed as $$\Delta p_1 = p_1 - p_a. \qquad (1)$$

The second actuator device 110.4 includes a pressure regulation device 110.14 which supplies the second actuator chamber 110.12 with a second actuator fluid at a second pressure $p_2$, so that in the second actuator chamber 110.12 a second relative pressure $\Delta p_2$ establishes itself relative to the pressure $p_a$ of the atmosphere surrounding the force actuator 112, which may be expressed as $$\Delta p_2 = p_2 - p_a. \qquad (2)$$

The first pressure-regulating device 110.13 and the second pressure-regulating device 110.14 belong to a pressure-regulating unit 110.15. The first pressure-regulating device 110.13 is designed so that it regulates the first pressure in the first actuator chamber 110.11 up to a first maximum pressure $p_{max1}$. The second pressure-regulating device 110.14 is of analogous configuration, so that it regulates the second pressure in the second actuator chamber 110.12 up to a second maximum pressure $p_{max2}$.

Each of the first actuator fluid and the second actuator fluid in the present example is a gaseous medium, for example air. However, it is considered self-evident that in different versions of the invention one could also use a liquid medium. It is also possible to use different media for the first actuator fluid and the second actuator fluid.

The first wall element 110.3 and the second wall element 110.4 are both configured (at least in sections) in the form of a bellows, so that the force actuator 110 can achieve a relatively large displacement stroke along its thrust axis 110.1 without being opposed to any significant extent by elastic counter forces within the wall elements. The elastic restoring forces are normally of the order of 1% to 5% of the actuator force, i.e. of a magnitude that needs to be taken into account in practice, but can still be controlled.

Depending on the first pressure $p_1$ in the first actuator chamber 110.11, the first actuator device 110.3 by way of the actuator element 110.7 exerts a first actuator force $F_1$ on the lens holder 108. With the effective first thrust surface area $A_1$ of the first actuator chamber 110.11, the first actuator force $F_1$ can be calculated as $$F_1 = \Delta p_1 \cdot A_1, \qquad (3)$$

wherein the line of action of the first actuator force $F_1$ lies on the first thrust axis 110.9 of the first actuator device 110.3.

Analogously, depending on the second pressure $p_1$ in the second actuator chamber 110.12, the second actuator device 110.4 by way of the actuator element 110.7 exerts a second actuator force $F_2$ on the lens holder 108. With the effective second thrust surface area $A_2$ of the second actuator chamber 110.12, the second actuator force $F_2$ can be calculated as $$F_2 = \Delta p_2 \cdot A_2, \qquad (4)$$

wherein the line of action of the second actuator force $F_2$ lies on the second thrust axis 110.10 of the second actuator device 110.4.

In the neutral state illustrated in FIGS. 2 and 3, the first pressure $p_1$ and the second pressure $p_2$ are both equal to the pressure $p_a$, so that the first actuator device 110.3 and the second actuator device 110.4 exert no actuator force on the lens holder 109.1.

The effective second thrust surface area $A_2$ of the second actuator chamber 110.12 can be calculated for the illustrated example with the second effective radius $R_2$ of the second actuator chamber 110.12 (wherein $R_2$ can be calculated for the specific actuator device for example through sufficiently well known approximation formulas) as $$A_2 = R_2^2 \cdot \pi, \qquad (5)$$

while the effective first thrust surface area $A_1$ of the first actuator chamber 110.11 can be calculated with good approximation for the illustrated example with the first effective radius $R_1$ of the first actuator chamber 110.11 (wherein $R_1$ can be calculated for the specific actuator device for example through sufficiently well known simplified formulas) as $$A_1 = (R_1^2 - R_2^2) \cdot \pi. \qquad (6)$$

In the foregoing example, the ratio between the second effective thrust surface area and the first effective thrust surface area is accordingly $$\frac{A_2}{A_1} = \frac{R_2^2}{(R_1^2 - R_2^2)}. \qquad (7)$$

In terms of the ratio of the effective radii $$x = \frac{R_1}{R_2} \qquad (8)$$

equation (7) can be rewritten as:

$$\frac{A_2}{A_1} = \frac{1}{(x^2 - 1)} \qquad (9)$$

Thus, one obtains for the ratio between the second actuator force $F_2$ and the first actuator force $F_1$:

$$\frac{F_2}{F_1} = \frac{\Delta p_2 \cdot A_2}{\Delta p_1 \cdot A_1} = \frac{\Delta p_2}{\Delta p_1 \cdot (x^2 - 1)}. \qquad (10)$$

In the example shown, the first effective radius $R_1$ is three times as large as the second effective radius $R_2$, so that $x=3$. Thus, the second effective thrust surface area $A_2$ is 12.5% of the first effective thrust surface area $A_1$. Consequently, assuming an equal pressure ($p_1=p_2$) in the two actuator chambers 110.11 and 110.12, the second actuator force $F_2$ is likewise only 12.5% of the first actuator force $F_1$.

This leads to the conclusion that with identical amounts of pressure in the two actuator chambers 110.11 and 110.12, almost any desired ratio between the two actuator forces $F_1$ and $F_2$ can be selected by way of the ratio x between the effective radii.

In particular, this shows clearly that with a ratio of $x<\sqrt{2}$ the first effective thrust surface area $A_1$ is smaller than the second effective thrust surface area $A_2$, so that with identical pressure levels in the two actuator chambers the actuator force in the outer, ring-shaped chamber is smaller than the actuator force in the inner, cylindrical chamber. Accordingly, it is also possible to switch the spatial arrangement of the actuator devices, so that the actuator device that is to produce a higher-level actuator force is arranged on the inside and the actuator device that is to produce a lower-level actuator force is arranged on the outside.

Due to the concentric arrangement of the two actuator devices 110.3 and 110.4, the distance is zero between the respective lines of action of the first and second actuator forces $F_1$ and $F_2$ in the area of their points of application on the lens holder 108, and the lines of action are in parallel alignment. Consequently, the two actuator forces $F_1$ and $F_2$ simply superimpose themselves on each other, adding up to a resultant actuator force $F_{res}$, or expressed as an equation $$F_{res}=F_1+F_2, \quad (11)$$

wherein this arrangement has the added advantage that no torque is introduced into the lens holder 109.1.

As a means to largely prevent bending moments even if the lens holder 109.1 has been deformed by the resultant actuator force $F_{res}$ (whereby the point of application of the actuator force $F_{res}$ has been shifted), the actuator element 110.7 has in the area of contact with the lens holder 109.1 a protrusion 110.16 with a circular (ring-shaped) constriction 110.17. As a result, the protrusion 110.16 allows the force actuator 110 and the lens holder 109.1 to assume a tilted position relative to each other and thus prevents the transfer of a torque between them.

In this context, it should be understood that in other embodiments of the invention one could also envision a design concept where the thrust axes of the two actuator devices and thus the lines of action of the first and the second actuator force have a certain distance from each other at their respective points of application on the lens holder. This can be of advantage if a desired deformation of the lens holder is to be achieved or assisted by way of a torque which occurs as a result of the distance between the thrust axes and which is then introduced into the lens holder. However, the distance of the lines of action of the first and the second actuator force at their respective points of application on the lens holder is smaller than 50% (and with higher preference smaller than 10%) of the sum of the two effective radii $R_1$ and $R_2$ (more generally: of the sum of the maximum transverse dimensions of the actuator chamber at a right angle to its thrust axis), in order to keep the moment associated with this distance within a reasonable range.

Figure 4:
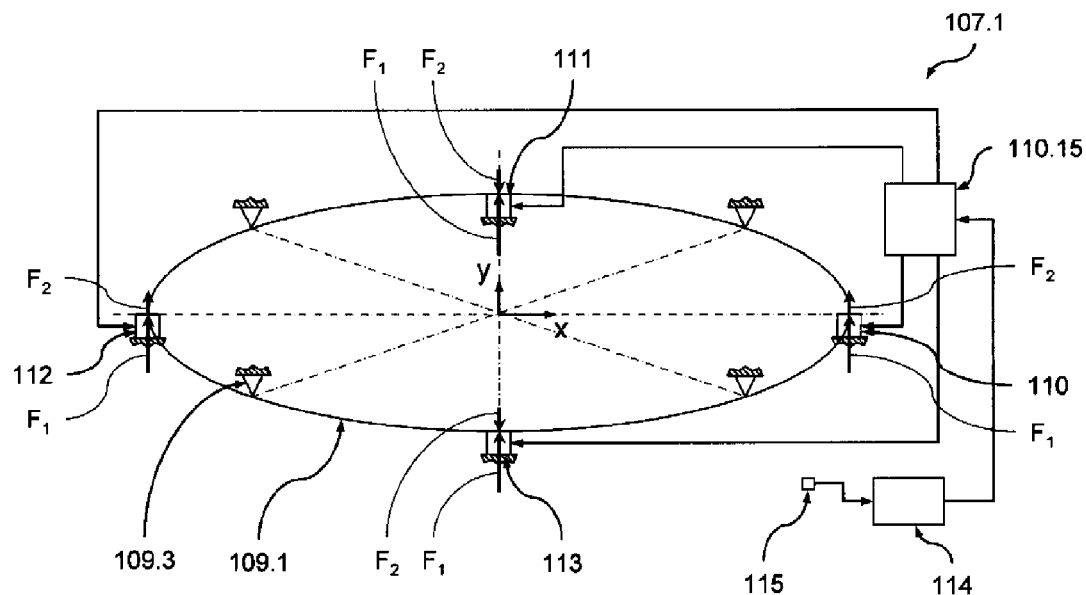
FIG. 4 represents a strongly simplified perspective view of the optical arrangement shown in FIG. 2.

As shown in FIG. 4 (which illustrates the force actuators 110 to 113, the holder elements 109.3 and the lens holder 109.1 in a strongly simplified perspective view from above) each of the force actuators 110 to 113 allows a first actuator force $F_1$ and second actuator force $F_2$ which are directed parallel to the optical axis 101.1 to be applied to the lens holder 109.1. In this arrangement, all first actuator forces F1 of all force actuators 110 to 113 can have the same direction, as shown in FIG. 4, so that the actuator forces in cooperation with the reactive forces of the holder elements 109.3 will cause a so-called 4-wave deformation of the lens holder 109.1 and thus of the lens 108.

In contrast, the second actuator forces $F_2$ of the force actuators 110 and 112 can have the opposite direction of the second actuator forces F2 of the force actuators 111 and 113 (by setting a corresponding sub-ambient pressure in the second actuator chamber 110.12 relative to the surrounding atmosphere), so that the actuator forces in cooperation with the reactive forces of the holder elements 109.3 will cause a so-called 2-wave deformation of the lens holder 109.1 and thus of the lens 108.

The setting of the actuator forces is controlled by way of the first and second pressure-regulating devices 110.13, 110.14, wherein the first pressure-regulating device 110.13 includes a pressure regulation loop which sets the same first pressure $p_1$ in all first actuator chambers 110.11 of the force actuators 110 to 113. The second pressure-regulating device 110.13 has two pressure regulation loops, wherein the first pressure regulation loop serves to set an above-ambient pressure in the second actuator chambers of the force-actuators 110 and 112, and the second pressure regulation loop serves to set a sub-ambient pressure in the second actuator chambers of the force-actuators 111 and 113.

The 2-wave deformation of the lens 108 requires markedly smaller actuator forces than the 4-wave deformation, so that the second actuator forces $F_2$ are of significantly smaller absolute magnitude than the first actuator forces $F_1$. In the present example, the force required for a 4-wave deformation of the lens 108 is about eight times as large as the force required for a 2-wave deformation with the same maximum displacement amplitude.

As the different effective thrust surface areas $A_1$ and $A_2$ already by themselves ensure a corresponding force ratio between the respective first actuator force $F_1$ and the second actuator force $F_2$ and thus a commensurate difference in the force levels for the 2-wave deformation and the 4-wave deformation, the embodiment according to this example offers the advantageous possibility to use components of identical design for the two pressure-regulating devices 110.13 and 110.14.

Accordingly, the first maximum pressure $p_{max1}$ for which the first pressure-regulating device 110.13 is designed is equal to the second maximum pressure $p_{max2}$ for which the second pressure-regulating device 110.14 is designed. With an appropriate choice of the effective thrust surface areas A1 and A2, this therefore opens an advantageous possibility to operate each of the pressure-regulating devices in an optimum range where its setting accuracy has its maximum, so that errors in setting the pressure in the respective actuator chambers 110.11, 110.12 and thus controlling the deformation of the lens 108 are minimized.

By arranging the actuator devices 110.3 and 110.4 so that their respective kinematic actions are parallel and as a result the separately generated first actuator force $F_1$ and second actuator force $F_2$ are superimposed on each other, it is possible (unlike in the prior-art concept of superimposing the pressures on each other within a single actuator chamber) to achieve for both actuator forces $F_1$ and $F_2$, in spite of the different respective force levels, an optimum in the absolute accuracy of setting the respective pressure in each of the actuator chambers 110.11 and 110.12 and thus setting the respective actuator forces $F_1$ and $F_2$.

However, it should be understood that in other versions of the invention, actuator forces of different levels of magnitude could also be generated —in addition or as an alternative to setting the levels through the effective thrust surfaces $A_1$ and $A_2$—through a suitable choice of the pressure level of the respective pressure-regulating device (i.e. of the maximum pressure $p_{max}$ for which the respective pressure-regulating device is designed). Finally, in addition or as an alternative to these two concepts, the force level could also be set by way of a suitable force-reduction device that is interposed between each actuator chamber and the lens.

During the projection of the design pattern of the mask 103.1 onto the substrate 105.1, the geometry or, more specifically, the deformation of the lens 108 is actively adjusted through the force actuators 110 to 113 under feedback control (or only open-loop control) by a controller in the form of a regulating device 114. The active adjustment of the deformation by way of the force actuators 110 to 113 is made in response to at least one imaging error of the imaging apparatus 101 and/or in response to at least one other operating quantity of the imaging apparatus 101 which is capable of being influenced by a deformation of the lens 108.

Of course, there is also the additional possibility of an active feedback regulation (or only an open-loop control) of the position (i.e. location and orientation) of the lens 108 by way of the holder elements 109.3. To perform this function, the holder elements 109.3 are connected likewise to the regulating device 114. The active adjustment of the position can again occur in response to at least one imaging error of the imaging apparatus 101 and/or in response to at least one other operating quantity of the imaging apparatus 101 which is capable of being influenced by a position change of the lens 108.

The current value of this imaging error and/or the at least one other operating quantity of the imaging apparatus 101 is captured by means of a transducer device 115 and transmitted to the regulating device 114. From this signal, the regulating device 114 generates corresponding control signals for the first and second pressure-regulating devices 110.13 and 110.14 which, in turn, set the corresponding pressure in the actuator chambers of the force actuators 110 to 113.

However, it should be understood that in other embodiments of the invention there does not have to be a direct detection of the imaging error and/or of the at least one other operating quantity of the imaging apparatus. Instead, the regulating device can operate with suitable models (established beforehand) of the imaging apparatus, which allow the control signals for the pressure-regulating devices to be determined on the basis of current values of variables and/or parameters of the imaging apparatus.

Figure 5:
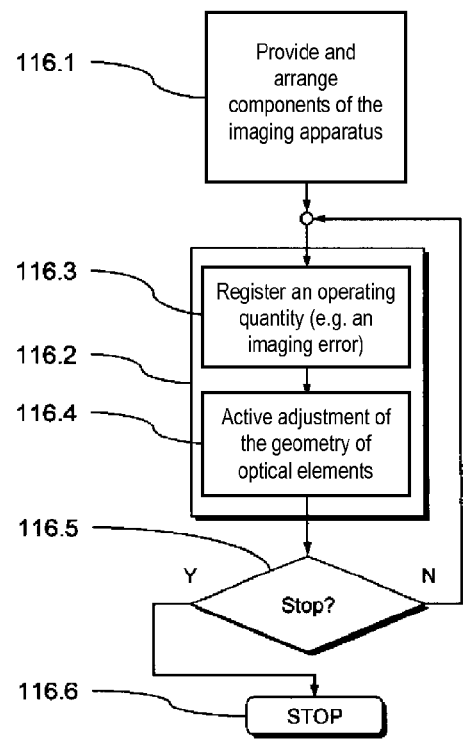
FIG. 5 represents a flowchart diagram of a preferred embodiment of the optical imaging method according to the invention, which can be carried out with the optical imaging apparatus of FIG. 1, using a preferred embodiment of the method according to the invention for generating and applying forces.

With the imaging apparatus 101 of FIG. 1 a preferred embodiment of the optical imaging method according to the invention can be performed, wherein a preferred embodiment of the method of generating and applying forces according to the invention is implemented, as will be explained in more detail in the following, making reference to FIG. 5 as well as FIGS. 1 to 4.

First, in a step 116.1, the components of the imaging apparatus 101, in particular the lens 108 and the supporting structure 109, are made available and are brought into their spatial arrangement with a resultant configuration as described above in FIGS. 1 to 4.

Next, in a step 116.2, the design pattern of the mask 103.1 is projected onto the substrate 105.1 (this operation may be divided into several steps and/or cycles). In a step 116.3, simultaneously with this exposure process of the substrate 105.1, the current value of an imaging error or of another operating quantity of the imaging apparatus 101 is registered by way of the transducer device 115, as has been described above.

In a step 116.4, the lens 108 is being actively deformed by the force actuators 110 to 113 (in response to control signals of the regulating device 114), meaning that the geometry of the lens 108 is actively regulated, as has also been described above. Furthermore, the position of the lens 108 can likewise be actively regulated, as has also been described above.

In step 116.5, a test is made as to whether or not the process is to be terminated. In the negative case, (for example if a further substrate 105.1 is to be exposed), the process loops back to step 116.2. In the affirmative case, the process ends in a step 116.6.

In the foregoing description, the invention has been presented through an example in which two actuator chambers are nested inside each other. However, it should be understood that in other versions of the invention, there could also be more than two actuator chambers for (possibly more than two) different levels of force, which could again be nested inside each other.

Furthermore, the invention has been described above through an example where the second wall element 110.6 delimits the first actuator chamber 110.11 as well as the second actuator chamber 110.12. It should however be understood that other versions of the invention are also possible, where there is no such coupling link between the chambers. For example, there could be a separate wall element set up which forms the inner wall of the ring-shaped first actuator chamber.

Second Example

Figure 6:
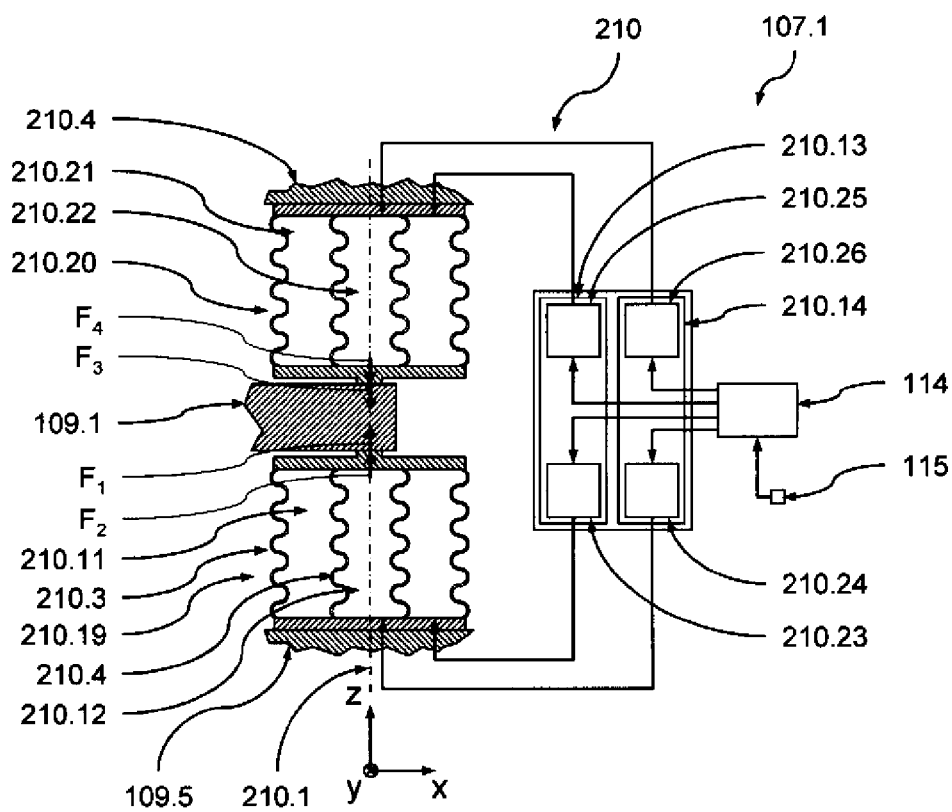
FIG. 6 represents a schematic partial cross-section of a part of a further preferred embodiment of the optical arrangement according to the invention.

In the following a further preferred embodiment in the form of a fluidic force actuator 210 within the actuator arrangement according to the invention is described with references to FIGS. 1 and 6. The view presented in FIG. 6 is analogous to FIG. 3.

In its principal design and function, the force actuator 210 is analogous to the force actuator 110 of FIGS. 1 to 4. In particular, the force actuator 210 can be used in place of the force actuator 110 in the imaging apparatus 101. Consequently, the following description will only cover the features in which the force actuator 210 differs from the force actuator 110. Components that are identical are identified by the same reference symbols raised by 100 and (unless there are expressly different explanations given in the following), the reader is referred to the previous description of those components.

The force actuator 210 differs from the force actuator 110 only in the sense that the first pressure-regulating device 210.13 and the second pressure-regulating device 210.14 are both designed for the function of generating in the respective actuator chambers only an above-ambient pressure relative to the surrounding atmosphere. Starting from the neutral state represented in FIG. 6 (where there is no pressure differential between any of the actuator chambers and the surrounding atmosphere and thus no force is applied by the force actuator 210), in order to be able to deform the lens 108 in both directions along the optical axis 101.1, i.e. along the thrust axis 210.1 of the force actuator 210, the first actuator device 210.3 of the force actuator 210, besides including a first actuator subassembly 210.19 with the first actuator chamber 210.11 and the second actuator chamber 210.12, also comprises an identically configured second actuator subassembly 210.20 with a third actuator chamber 210.21 and a fourth actuator chamber 210.22.

The respective thrust axes of the actuator chambers 210.11, 210.12, 210.21 and 210.22 are collinear with the thrust axis 210.1 of the force actuator 210. While the first actuator subassembly 210.19 is arranged between the lower supporting element 109.5 and the lens holder 109.1, the second actuator subassembly 210.20 is arranged between the upper supporting element 210.4 and the lens holder 109.1, so that in the presence of an above-ambient pressure in all actuator chambers 210.11, 210.12, 210.21 and 210.22, the first actuator subassembly 210.19 and the second actuator subassembly 210.20 produce actuator forces that oppose each other.

The first actuator chamber 210.11 is connected to a first pressure-regulating loop 210.23 of the first pressure-regulating device 210.13, while the second actuator chamber 210.12 is connected to a second pressure-regulating loop of the second pressure-regulating device 210.14. The third actuator chamber 210.21, in turn, is connected to a third pressure-regulating loop 210.25 of the first pressure-regulating device 210.13, while the fourth actuator chamber 210.22 is connected to a fourth pressure-regulating loop of the second pressure-regulating device 210.14. The pressure-regulating loops 210.23 to 210.26 regulate the pressure again in response to control signals of the regulating device 114. The latter again generates the control signals in response to signals of the transducer device 115, as has been explained above in the context of the first example.

Under an above-ambient pressure relative to the surrounding atmosphere, the third actuator chamber 210.21 generates a third actuator force $F_3$ that is opposed to the first actuator force $F_1$, while the fourth actuator chamber 210.22 generates a fourth actuator force $F_4$ that is opposed to the second actuator force $F_2$. The actuator forces $F_1$ to $F_4$, superimposed on each other, produce the resultant actuator force $F_{res}$ which causes the deformation of the lens holder 109.1 and thus of the lens 108. Depending on the pressure setting in the actuator chambers 210.11, 210.12, 210.21 and 210.22, the resultant actuator force $F_{res}$ can take either direction along the thrust axis 210.1 of the force actuator 210, so that a deformation of the lens holder 109.1, and thus of the lens 108, can be achieved in both directions along the optical axis 101.1.

It is evident that with this force actuator 210, too, the imaging method according to the invention, as described above in the context of FIG. 5, can be carried out, wherein the afore-described method of generating and applying a force according to the invention is used.

Third Example

Figure 7:
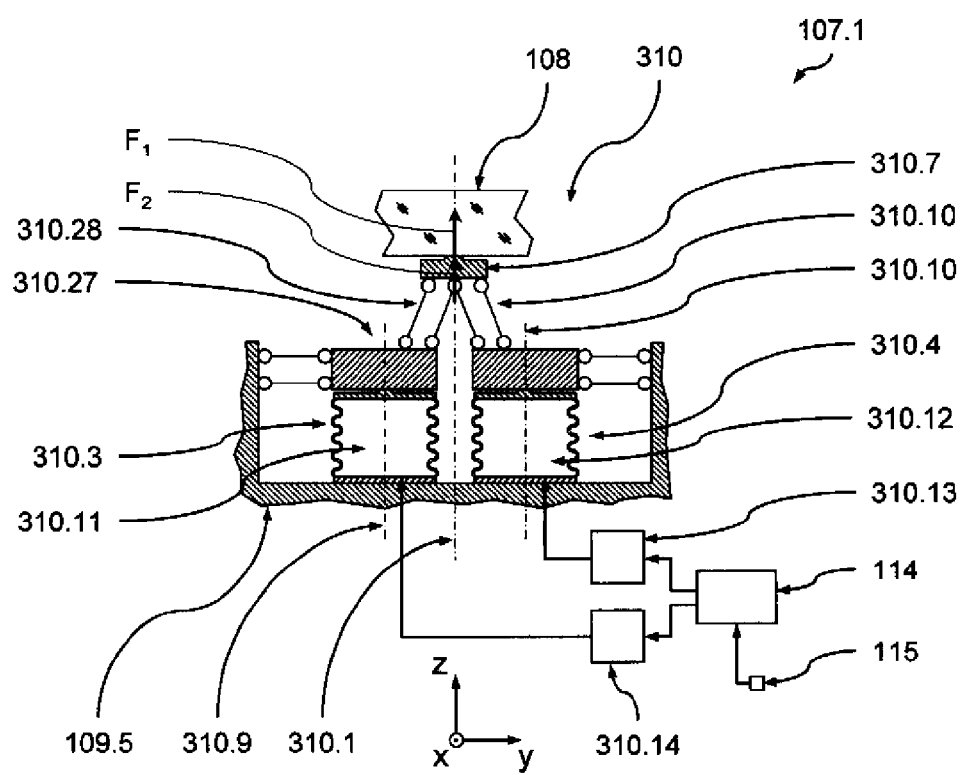
FIG. 7 represents a schematic partial cross-section of a part of a further preferred embodiment of the optical arrangement according to the invention.

In the following, a further preferred embodiment in the form of a fluidic force actuator 310 within the actuator arrangement according to the invention is described with references to FIGS. 1 and 7. The view presented in FIG. 7 is analogous to FIG. 3. However, the drawing plane in FIG. 7 is oriented in the tangential direction of the circumference of the lens 108. Of course, in other embodiments of the invention the arrangement illustrated in FIG. 7 could also lie in a drawing plane with any other desired orientation (particularly in a plane oriented in a radial direction of the lens 108).

In the principal design of its components and in its function, the force actuator 310 is analogous to the force actuator 110 of FIGS. 1 to 4. In particular, the force actuator 310 can be used in place of the force actuator 110 in the imaging apparatus 101. Consequently, the following description will only cover the features in which the force actuator 310 differs from the force actuator 110. Components that are identical are identified by the same reference symbols raised by 200 and (unless there are expressly different explanations given in the following), the reader is referred to the previous description of those components.

The force actuator 310 differs from the force actuator 110 only in the sense that instead of the actuator devices nested inside each other, the force actuator 310 has two actuator devices 310.3 and 310.4 arranged kinematically parallel to each other, with actuator chambers 310.11 and 310.12 arranged side by side. The first actuator chamber 310.11 and the second actuator chamber 310.12 are coupled by way of a coupling device 310.27 with parallel-guiding linkages 310.28 and 310.29 (which are sufficiently well known and therefore not further explained here) to the actuator element 310.7 which, in turn, is connected directly to the lens 108. In this arrangement, the coupling device 310.27 is, in turn, movably constrained through parallel-guiding linkages (which are sufficiently well known and therefore not further explained here) to the supporting element 109.5.

The parallel-guiding linkages 310.28, 310.29 in the illustrated example are tied to the actuator element 310.7 in such a way that the actuator element 310.7 has to sustain no bending moment. It should be understood, however, that the parallel-guiding linkages 310.28, 310.29 in other embodiments of the invention could also be tied to the actuator element 310.7 in a way that causes a bending moment. For example, the respective left arms of the two parallel-guiding linkages 310.28, 310.29 could be tied to the same point on the actuator element 310.7, while the respective right arms of the two parallel-guiding linkages 310.28, 310.29 could also be tied to the same point on the actuator element 310.7.

The first actuator chamber 310.11 is connected to a first pressure-regulating device 310.13, while the second actuator chamber 310.12 is connected to a second pressure-regulating device 310.14. The pressure-regulating devices 310.13 and 310.14 regulate the pressure in the respective actuator chambers 310.11 and 310.12 again in response to control signals of the regulating device 114 which, in turn, generates the control signals in response to signals of the transducer device 115, as has been explained above in the context of the first example.

When they are subjected to a certain pressure differential relative to the surrounding atmosphere, the first actuator chamber 310.11 and the second actuator chamber 310.12, along their respective thrust axes 310.9 and 310.10, generate pressure-dependent forces which are converted, respectively, into a first actuator force $F_1$ and a second actuator force $F_2$ which are transferred to the lens 108 in the area where the actuator element 310.7 makes contact with the lens 108.

The actuator forces $F_1$ and $F_2$, superimposed on each other, produce the resultant actuator force $F_{res}$ which causes the deformation of the lens 108. In this case, too, the resultant actuator force $F_{res}$ can take either direction along the thrust axis 310.1 of the force actuator 310, depending on the pressure that was set in the actuator chambers 310.11 and 310.12, so that a deformation of the lens 108 can be achieved in both directions along the optical axis 101.1.

It is evident that with this force actuator 310, too, the imaging method according to the invention, as described above in the context of FIG. 5, can be carried out, wherein the afore-described method of generating and applying a force according to the invention is used.

As can be seen in FIG. 7, the first actuator chamber 310.11 and the second actuator chamber 310.12 are configured identically so that, among other shared traits, they have identical effective thrust surface areas. The different force levers of the first and the second actuator force $F_1$, $F_2$ in this embodiment can also be achieved through different pressure levels of the pressure-regulating devices 310.13 and 310.14 (i.e. by designing the pressure-regulating devices 310.13 and 310.14 for different respective maximum pressures $p_{max}$).

It should again be understood that in other embodiments of the invention an adaptation to different force levels of the actuator forces $F_1$ and $F_2$ could be achieved through the effective thrust surface areas of the actuator chambers, as has been described above in the context of the first example.

The present example also offers the possibility to achieve an adaptation to different force levels of the actuator forces $F_1$ and $F_2$ through a specific design of the coupling device 310.27 or by shifting the location of the thrust axes 310.9 and 310.10 of the actuator chambers relative to the thrust axis 310.1 of the force actuator 310. For example, the distance between the thrust axis 310.1 of the force actuator 310 and the thrust axis 310.10 of the second actuator chamber 310.12 can be increased further in order to commensurately lower the force level of the second actuator force $F_2$.

Fourth Example

Figure 8:
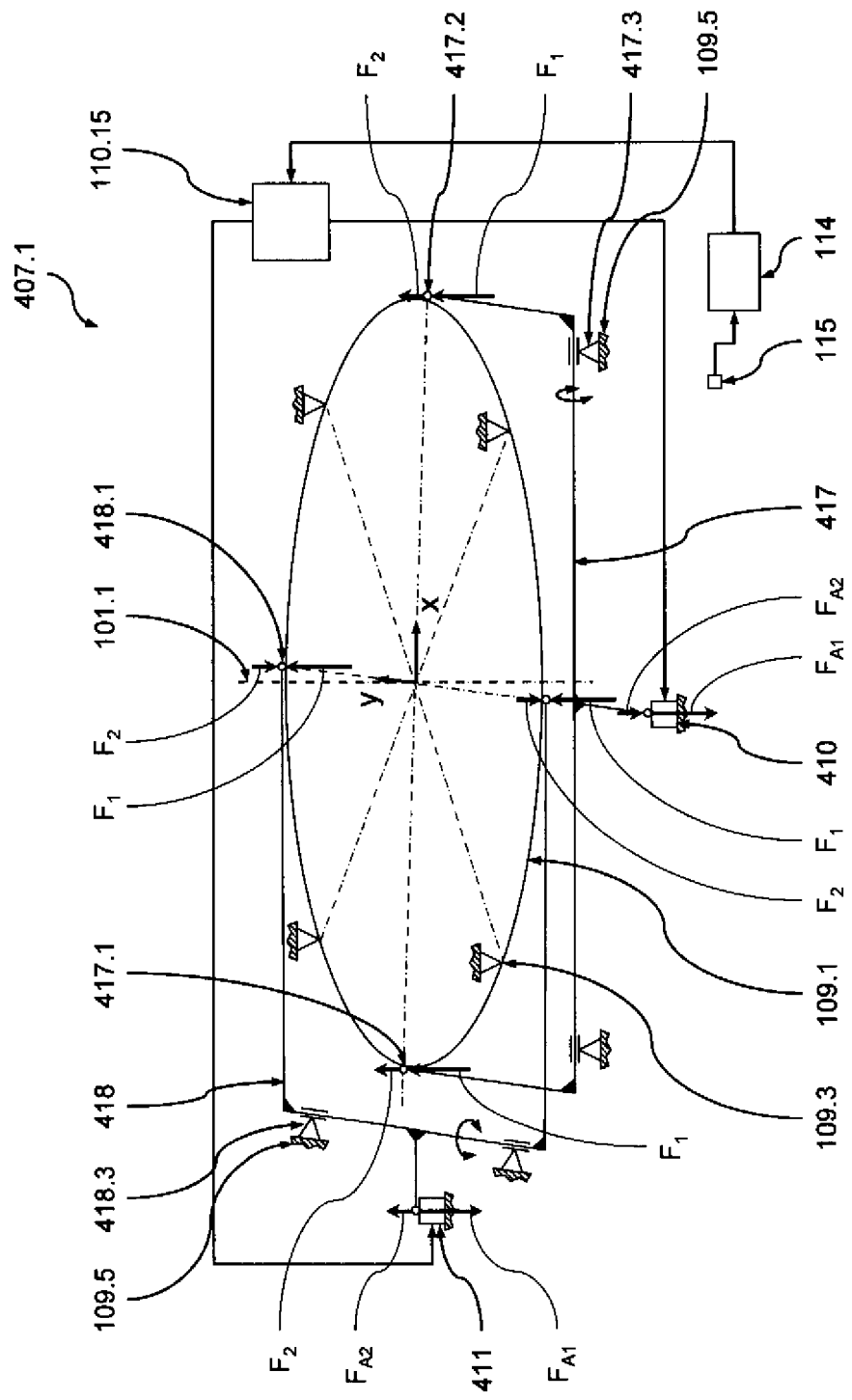
FIG. 8 represents a strongly simplified perspective view of a further preferred embodiment of the optical arrangement according to the invention.

In the following a further preferred embodiment in the form of an optical module 407.1 within the actuator arrangement according to the invention is described with references to FIGS. 1 and 6. The view presented in FIG. 8 is analogous to FIG. 4.

In its principal design and function, the optical module 407.1 is analogous to the optical module 107.1 of FIGS. 1 to 4. In particular, the optical module 407.1 can be used in place of the optical module 107.1 in the imaging apparatus 101. Consequently, the following description will only cover the features in which the optical module 407.1 differs from the optical module 107.1. In particular, components that are identical are identified by the same reference symbols raised by 300 and (unless there are expressly different explanations given in the following), the reader is referred to the previous description of those components.

The optical module 407.1 differs from the optical module 107.1 only in the sense that the supporting structure 109 has only two, rather than four, identically configured actuator arrangements in the form of fluidic force actuators 410 and 411, which are offset by 90° relative to each other on the circumference of the lens holder 109.1. However, it should be understood that other embodiments of the invention can also have any other desired number of force actuators, wherein the number of force actuators depends on a desired mode of deformation of the optical element 108, as will be explained in detail at a later point.

The force actuators 410 and 411 are of identical configuration as the force actuators 110 and 111. In contrast to the first example, the force actuators 410 and 411 are not acting directly on the supporting structure 109 (shown for the lens 108 in FIG. 2) but through respective transmitting mechanisms 417 and 418, which will be described subsequently in more detail. The first transmitting mechanism 417 acts on the optical element 108 through the points of application 417.1 and 417.2, while the second transmitting mechanism 418 acts on the optical element 108 through the points of application 418.1 and 418.2. The points of application 417.1 and 417.2 are arranged (relative to the optical axis 101.1) with an angular offset of about 180°, meaning that they lie diametrically opposite each other across the center point of the lens 108.

The holder elements 109.3 and the points of application of the transmitting mechanisms 417 and 418 are arranged on the circumference of the lens holder 109.1 in alternating order and with essentially uniform spacing, so that each holder element 109.3 is offset or rotated against a neighboring point of application of one of the transmitting mechanisms 417 and 418 by an angle of about 45° about the optical axis 101.1.

Each of the transmitting mechanisms 417 and 418 in the illustrated example is configured as a fork-shaped lever arm which is rotatably constrained in bearing elements 417.3 and 418.3, respectively, on the lower supporting ring 109.5. The swiveling axis which is thereby defined for each of the lever arms 417 and 418 runs parallel to the main plane in which the optical element 108 principally extends (i.e. perpendicular to the optical axis 101.1). Furthermore, the swiveling axis of each lever arm 417, 418 and the respectively associated points of application 417.1, 417.2 and 418.1, 418.2 are each arranged at least approximately in a common plane that extends parallel to the principal plane of the optical element, so that the forces F1, F2 exerted, respectively, on the points of application 417.1, 417.2 and 418.1, 418.2, are directed essentially parallel to the optical axis.

Depending on the amount of pressure $p_1$, $p_2$ in the respective actuator chambers of the force actuators 410 and 411, the force actuators 410 and 411 exert on the respectively associated lever arm 417 and 418 a first actuator force $F_{A1}$ and a second actuator force $F_{A2}$. With the respective transmission ratios g of the lever arms 417 and 418, effective forces $F_1$ and $F_2$ are therefore exerted at the points of application 417.1, 417.2 and 418.1, 418.2 on the lens holder 108, wherein because of the symmetrical configuration (relative to the thrust plane of the actuator forces $F_{A1}$ and $F_{A2}$) of the lever arms 417 and 418, the forces $F_1$ and $F_2$ conform to the relationships:

$$F_1 = \frac{g \cdot F_{A1}}{2}, \tag{12}$$

$$F_2 = \frac{g \cdot F_{A2}}{2}. \tag{13}$$

As can be seen in FIG. 8, first and second effective forces $F_1$ and $F_2$ directed parallel to the optical axis 101.1 can be applied to the lens holder 109.1 by way of the force actuators 410 and 411 and the lever arms 417 and 418, respectively. In this arrangement, the first effective forces $F_1$ can have the same direction, so that in cooperation with the reactive forces of the holder elements 109.3, the first effective forces $F_1$ produce a so-called 4-wave deformation of the lens holder 109.1, and accordingly of the lens 108.

In contrast, the second effective forces $F_2$ of the one force actuator 410 (with an appropriate sub-ambient pressure setting relative to the surrounding atmosphere) can have the opposite direction of the second effective forces $F_2$ of the other force actuator 411, so that they generate in cooperation with the reactive forces of the holder elements 109.3 a so-called 2-wave deformation of the lens holder 109.1 and, consequently, of the lens 108.

The setting of the actuator forces and thus of the effective forces on the lens holder 109.1 is performed again by way of the pressure-regulating unit 110.15, as described in detail in the context of the first embodiment.

The present configuration with only one force actuator 410 and 411, respectively, for generating effective forces at diametrically opposite points of application 417.1, 417.2 and 418.1, 418.2 has the advantage over the embodiment of FIG. 4 that due to the achievable manufacturing accuracy of the respective transmitting mechanisms 417 and 418, it is easy to ensure that the effective forces at the diametrically opposite points of application 417.1, 417.2 and 418.1, 418.2 have the same absolute magnitude. With the embodiment of FIG. 4, this is more difficult to achieve, as the two diametrically opposed force actuators 110 and 112 as well as 111 and 113 have to be either precisely matched or have to be equipped with separate pressure-regulating loops.

In other words, by generating with a single actuator multiple effective forces that are in a precisely defined ratio to each other (which can be easily realized through the transmitting mechanism), it is possible to significantly reduce the manufacturing cost of the optical module. In this context, it should be understood that in other embodiments of the invention (dependent in particular on the deformation mode that is to be produced) it is also possible with a single actuator to generate more than two effective forces (by way of a suitably configured transmitting mechanism) with a precisely defined ratio.

It should be expressly noted here that the foregoing concept of producing a plurality of effective forces of a precisely defined ratio by means of a single actuator represents an inventive concept capable of being protected by itself, independent of the design of the force actuator.

While the design pattern of the mask 103.1 is being projected onto the substrate 105.1, the geometry or, more specifically, the deformation of the lens 108 is actively set by way of the force actuators 410 and 411 under feedback regulation (or also merely with open-loop control) by a controller device in the form of a regulating device 114. The active setting of the deformation by way of the force actuators 410 and 411 occurs in a way that is dependent on at least one imaging error of the imaging device 101 and/or at least one other operating quantity of the imaging device 101 that is capable of being influenced by a deformation of the lens 108.

Of course, there is also the additional possibility of an active feedback regulation (or only an open-loop control) of the position (i.e. location and orientation) of the lens 108 by way of the holder elements 109.3. To perform this function, the holder elements 109.3 are connected likewise to the regulating device 114. The active adjustment of the position can again occur in response to at least one imaging error of the imaging apparatus 101 and/or in response to at least one other operating quantity of the imaging apparatus 101 which is capable of being influenced by a position change of the lens 108.

The current value of this imaging error and/or the at least one other operating quantity of the imaging apparatus 101 is captured by means of a transducer device 115 and transmitted to the regulating device 114. From this signal, the regulating device 114 generates corresponding control signals for the pressure-regulating device 110.15 which, in turn, set the corresponding pressure in the actuator chambers of the force actuators 410 and 411.

However, it should be understood that in other embodiments of the invention there does not have to be a direct detection of the imaging error and/or of the at least one other operating quantity of the imaging apparatus. Instead, the regulating device can operate with suitable models (established beforehand) of the imaging apparatus, which allow the control signals for the pressure-regulating devices to be determined on the basis of current values of variables and/or parameters of the imaging apparatus.

It is evident that in this example, too, the imaging method according to the invention, as described above in the context of FIG. 5, can be carried out, wherein the afore-described method of generating and applying a force according to the invention is used.

The foregoing description of the present invention is based primarily on examples (first and second example) where the optical element (lens 108) is held by a holder device (lens holder 109.1) which is firmly connected to the optical element and which is being deformed by force actuators, whereby due to the connection between the holder device and the optical element, a corresponding deformation is also imparted to the optical element. However, it should be understood that one could also envision an arrangement in other embodiments of the invention where the force actuators are connected directly to the optical element, as in the third example, so that the force actuators deform the optical element itself.

Furthermore, the foregoing description of the present invention involves only examples in which the resultant actuator force $F_{res}$ of the force actuators produces a deformation of an optical element. However, it should be understood that one could also envision arrangements in other embodiments of the invention where the resultant actuator force $F_{res}$ is used for purposes other than causing a deformation of a body. In particular, the possibility exists to use the resultant actuator force $F_{res}$ for effecting a change in position (i.e. location and/or orientation) of the body. It should further be understood that the resultant actuator force $F_{res}$ can be applied to bodies other than optical elements and/or their mounting elements.

Furthermore, the foregoing description of the present invention involves only examples in which a 2-wave deformation and a 4-wave deformation are produced through a plurality of force actuators. It should be understood, however, that other embodiments of the invention could be envisioned with only a single force actuator exerting a corresponding force on a body of any kind.

Furthermore, one could of course also use any other number of force actuators. For the correction of image errors, one could for example generate any desired N-wave deformation (with the maximum order N being an integer larger than 1) by means of a corresponding number N of force actuators exerting their actuator forces on the optical element (normally parallel to the optical axis of the optical system) at N positions distributed (in particular with uniform spacing) along the circumference of the optical element. Between every two neighboring points of application of the actuator forces, the optical element is normally supported by a passive support element or an active support element (i.e. a further actuator) arranged in particular midway in the circumferential direction between the points of application of the actuator. In this context it should be understood that only in special cases (for example 2- and 4-wave deformation) are passive support elements arranged between each two actuators. If the optical element is supported exclusively by actuators, there are consequently at least 2N actuators required for a maximum order N of the wave-shaped deformation.

Expressed in more general terms, in an arrangement which is designed for a maximum order N of the wave-shaped deformation, all deformation orders can be realized which are obtained by prime factorization of the maximum order N and by multiplying any of the resultant prime factors $N_i$ either with a value of 1 or with one or more of the other prime factors $N_j$. Consequently, with a maximum order of $$N=12=2\cdot 2\cdot 3 \tag{14}$$

it is possible to realize wave deformations of the orders 2, 3, 4, 6 and 12.

Furthermore, the foregoing description of the present invention is based exclusively on examples with fluidic actuators. It is therefore noted once more that to put the invention into practice one could select any actuator principles for the two actuator devices. Accordingly, any electrical and/or fluidic actuators could be used in order to realize the two actuator devices. Of course, it is also possible to arbitrarily combine different actuator principles with each other.

As a last remark, the present invention has been described herein exclusively in connection with a microlithography apparatus which operates with a wavelength of 193 nm. It is however considered self-evident that the invention can also be used in connection with any other optical apparatus operating at different wavelengths. In particular, the invention can also be used in connection with so-called EUV systems which operate at wavelengths below 20 nm (typically in the range of 13 nm).

The invention claimed is:

1. An actuator arrangement, comprising:
a first fluidic-based actuator device having a first maximum possible exertable force, the first fluidic based actuator being designed to exert the first maximum possible exertable force on a first location of a body associated with the first actuator device;
a second fluidic-based actuator device having a second maximum possible exertable force, the second fluidic based actuator being designed to exert the second maximum possible exertable force on a second location of the body associated with the first actuator device,
wherein the second maximum possible exertable force is less than the first maximum possible exertable force, and
wherein the first fluidic-based actuator device comprises a first actuator chamber, the second fluidic-based actuator device comprises a second actuator chamber, and the second actuator chamber is nested inside the first actuator chamber.

2. The actuator arrangement according to claim 1, wherein the first actuator chamber defines a first axis collinear with the first maximum possible exertable force, the second actuator chamber defines a second axis collinear to the second maximum possible exertable force, and the first and second axes are substantially collinear.

3. The actuator arrangement according to claim 1, wherein the first and second maximum possible exertable forces are parallel.

4. The actuator arrangement according to claim 1, wherein the first and second maximum possible exertable forces are collinear.

5. The actuator arrangement according to claim 1, wherein the first actuator chamber defines a first axis collinear with the first maximum possible exertable force, the second actuator chamber defines a second axis collinear to the second maximum possible exertable force, and the first and second axes are substantially parallel.

6. The actuator arrangement according to claim 1, wherein the first actuator chamber defines a first axis collinear with the first maximum possible exertable force, the second actuator chamber defines a second axis collinear to the second maximum possible exertable force, and the first and second axes are substantially collinear.

7. The actuator arrangement according to claim 1, wherein the first actuator chamber defines a first axis collinear with the first maximum possible exertable force, the second actuator chamber defines a second axis collinear to the second maximum possible exertable force, the first actuator chamber has a maximum transverse dimension crosswise to the first axis, the second actuator chamber has a maximum transverse dimension crosswise to the second axis, and a distance between the lines of action is less than 50% of a sum of the maximum transverse dimension of the first actuator chamber and the maximum transverse dimension of the second actuator chamber.

8. The actuator arrangement according to claim 7, wherein the distance between the lines of action is less than 10% of a sum of the maximum transverse dimension of the first actuator chamber and the maximum transverse dimension of the second actuator chamber.

9. The actuator arrangement according to claim 1, wherein the first actuator chamber is at least partially delimited by a first wall element configured as a bellows, and/or the second actuator chamber is at least partially delimited by a second wall element configured as a bellows.

10. The actuator arrangement according to claim 1, further comprising an actuator element configured to cooperate with the body, wherein the first and second fluidic-based actuator devices are coupled to the actuator element.

11. The actuator arrangement according to claim 10, wherein the first actuator chamber is partially delimited by the actuator element, and/or the second actuator chamber is partially delimited by the actuator element.

12. The actuator arrangement according to claim 1, wherein:
the first fluidic-based actuator device comprises a pressure-regulating device configured to generate the first maximum possible exertable force by pressurizing the first actuator chamber with an actuator fluid having a first maximum pressure; and
the second actuator device comprises a pressure-regulating device configured to generate the second maximum possible exertable force by pressurizing the second actuator chamber with an actuator fluid having a second maximum pressure.

13. The actuator arrangement according to claim 12, wherein the first actuator chamber has a first surface area that is effective in the generation of the first maximum possible exertable force, the second actuator chamber has a second surface area that is effective in the generation of the second maximum possible exertable force, and the second surface area is smaller than the first surface area.

14. The actuator arrangement according to claim 13, wherein the second surface area is at most 50% of the first surface area.

15. The actuator arrangement according to claim 12, wherein at least one of the following conditions is met:
the first pressure-regulating device is designed to establish in the first actuator chamber at least one pressure selected from the group consisting of a sub-ambient pressure relative to the atmosphere surounding the first actuator chamber and an above-ambient pressure relative to the atmosphere surrounding the first actuator chamber; and
the second pressure-regulating device is designed to establish in the second actuator chamber at least one pressure selected from the group consisting of a sub-ambient pressure relative to the atmosphere surrounding the first actuator chamber and an above-ambient p ressure relative to the atmosphere surrounding the second actuator chamber.

16. The actuator arrangement according to claim 12, wherein at least one of the following conditions is met:
the first fluidic-based actuator device comprises a third actuator chamber and a third pressure-regulating device configured to pressurize the third actuator chamber with an actuator fluid to generate a third force which opposes the first force; and
the second fluidic-based actuator device comprises a fourth actuator chamber and a fourth pressure-regulating device configured to pressurize the fourth actuator chamber with an actuator fluid in order to generate a fourth force which opposes the second force.

17. The actuator arrangement according to claim 16, wherein the third force is parallel to the first force, and/or the fourth force is parallel to the second force.

18. The actuator arrangement of claim 12, wherein the second maximum pressure is less than the first maximum pressure.

19. The actuator arrangement of claim 18, wherein the second maximum pressure is at most 50% of the first maximum pressure.

20. The actuator arrangement of claim 1, wherein the actuator arrangement is configured to be used in a microlithography apparatus.

21. An apparatus, comprising:
the actuator arrangement of claim 1,
wherein the apparatus is a microlithography apparatus.

22. An optical arrangement, comprising:
an optical element; and
an actuator arrangement according to claim 1 connected to the optical element,
wherein the optical arrangement is configured to be used in a microlithography apparatus.

23. An apparatus, comprising:
an illumination system; and
a projection system comprising a plurality of optical elements and an actuator arrangement according to claim 1,
wherein the illumination system is designed to illuminate a first object, the projection system is designed to project an image of the object onto a second object, and the apparatus is a microlithography apparatus.

24. The apparatus of claim 23, wherein the first object is a mask, and the second object is a substrate.

25. An actuator arrangement, comprising:
a first fluidic-based actuator device designed to exert a first force on a first location of a body associated with the first actuator device;
a second fluidic-based actuator device designed to exert a second force on a second location of the body associated with the first actuator device,
wherein the first fluidic-based actuator device comprises a first actuator chamber, the second fluidic-based actuator device comprises a second actuator chamber, the second actuator chamber is nested inside the first actuator chamber, and
wherein the first fluidic-based actuator device has a first maximum possible exertable force that it can exert on the first location, the second fluidic-based actuator device has a second maximum possible exertable force that it can exert on the second location, and the second maximum possible exertable force is less than the first maximum possible exertable force, and
wherein the second maximum possible exertable force is at most 50% of the first maximum possible exertable force.

26. The actuator arrangement according to claim 25, wherein:
the first fluidic-based actuator device comprises a pressure-regulating device configured to generate the first maximum possible exertable force by pressurizing the first actuator chamber with an actuator fluid having a first maximum pressure; and
the second fluidic-based actuator device comprises a pressure-regulating device configured to generate the second maximum possible exertable force by pressurizing the second actuator chamber with an actuator fluid having a second maximum pressure.

27. The actuator arrangement according to claim 26, wherein the first fluidic-based actuator chamber has a first surface area that is effective in the generation of the first maximum possible exertable force, the second actuator chamber has a second surface area that is effective in the generation of the second maximum possible exertable force, and the second surface area is smaller than the first surface area.

28. The actuator arrangement according to claim 26, wherein the second maximum pressure is less than the first maximum pressure.

29. The actuator arrangement according to claim 26, wherein the second surface area is at most 50% of the first surface area.

30. An apparatus, comprising:
the actuator arrangement of claim 25,
wherein the apparatus is a microlithography apparatus.

31. An optical arrangement, comprising:
an optical element; and
an actuator arrangement according to claim 25 connected to the optical element, wherein the optical arrangement is configured to be used in a microlithography apparatus.

32. An apparatus, comprising:
an illumination system; and
a projection system comprising a plurality of optical elements and an actuator arrangement according to claim 25,
wherein the illumination system is designed to illuminate a first object, the projection system is designed to project an image of the object onto a second object, and the apparatus is a microlithography apparatus.

\* \* \* \* \*

UNITED STATES PATENT AND TRADEMARK OFFICE
CERTIFICATE OF CORRECTION

PATENT NO.        : 8,528,461 B2                              Page 1 of 1
APPLICATION NO.   : 12/196391
DATED             : September 10, 2013
INVENTOR(S)       : Andreas Bertele et al.

It is certified that error appears in the above-identified patent and that said Letters Patent is hereby corrected as shown below:

In the Specification

Col. 1, line 7, delete "10 0 2007 040 363.3," and insert -- 10 2007 040 363.3, --.

Col. 4, line 19, delete "a an" and insert -- an --.

Col. 16, line 66, delete "diametrially" and insert -- diametrically --.

In the Claims

Col. 19, line 16, Claim 1, delete "fluidic based" and insert -- fluidic-based --.

Col. 19, lines 21-22, Claim 1, delete "fluidic based" and insert -- fluidic-based --.

Col. 19, lines 32-37, Claim 2, delete "The actuator arrangement according to claim 1, wherein the first actuator chamber defines a first axis collinear with the first maximum possible exertable force, the second actuator chamber defines a second axis collinear to the second maximum possible exertable force, and the first and second axes are substantially collinear." and insert -- The actuator arrangement according to claim 1, wherein the second maximum possible exertable force is at most 20% of the first maximum possible exertable force. --.

Col. 20, line 47, Claim 15, delete "surounding" and insert -- surrounding --.

Col. 20, line 55, Claim 15, delete "p ressure" and insert -- pressure --.

Signed and Sealed this
Twelfth Day of November, 2013

Teresa Stanek Rea
*Deputy Director of the United States Patent and Trademark Office*